United States Patent [19]

Potter et al.

[11] Patent Number: 4,769,592
[45] Date of Patent: Sep. 6, 1988

[54] SIX-PORT REFLECTOMETER TEST ARRANGEMENT

[75] Inventors: Christopher M. Potter, Stevenage; George Hjipieris, Hitchin, both of United Kingdom

[73] Assignee: Marconi Instruments Limited, Hertfordshire, United Kingdom

[21] Appl. No.: 948,054

[22] Filed: Dec. 31, 1986

[30] Foreign Application Priority Data

Jan. 17, 1986 [GB] United Kingdom ............... 8601108

[51] Int. Cl.$^4$ .................. G01N 22/00; G01R 27/06
[52] U.S. Cl. .............................. 324/58 B; 324/58 R; 324/58 A
[58] Field of Search .............. 324/58 B, 58.5 B, 58 R, 324/58.5 R, 58 A, 58.5 A

[56] References Cited

PUBLICATIONS

Hoer, "Using Six-Port & Eight-Port Junctions to Measure Active and Passive Circuit Parameters", NBS, 9-1975.

Hoer, "A Network Analyzer Incorporating Two Six-Port Reflectometers", IEEE Trans. on Microwave Theory and Techniques, vol. MIT-25, No. 12, 12-1977.

Primary Examiner—Reinhard J. Eisenzopf
Assistant Examiner—Jack B. Harvey
Attorney, Agent, or Firm—Spencer & Frank

[57] ABSTRACT

A test arrangement for testing high frequency electrical devices consists of two 6-port reflectometers which are both connected to a device under test. As well as being applied to the device under test, a reference sample of an excitation signal is routed to both 6-port reflectometers simultaneously. The test arrangement is capable of very wide operation and is able to fully characterize the electrical properties of a device.

6 Claims, 2 Drawing Sheets

SIX-PORT REFLECTOMETER TEST ARRANGEMENT

BACKGROUND OF THE INVENTION

This invention relates to a test arrangement which is suitable for performing electrical measurements on high frequency electrical devices. The invention is intended for operation in the radio frequency or microwave frequency range.

One of the most powerful techniques used to characterise radio frequency (R.F.) and microwave components is the Scattering Parameter (or S-Parameter) model. The R.F. device is treated as a "black box" with various input and output terminals. Each pair of terminals is termed a "port". The device's performance is quantified by applying a wave to one port and recording the emergent waves at each port caused by that wave. The relationships between the waves are expressed in a matrix of complex coefficients, called the S-parameter matrix.

These complex coefficients can be measured by means of a network analyser which separates out the required waves and evaluates their complex relationship. Automatic network analysers have been developed in which the frequency of a variable frequency oscillator is controlled over a particular frequency band. These analysers are very complex involving directional couplers or bridges to sample the incident and reflected waves. The samples are than ratioed to find the magnitude and phase of the reflection coefficient. This is a complicated step in practice, as phase angles cannot be directly measured at frequencies higher than about 500 kHz. Therefore, the system has to convert the RF samples down to a suitable frequency before measuring them. To do this while accurately maintaining their amplitude and phase relationships is both difficult and expensive. Mixers or samplers used in such a heterodyne system must be extremely linear.

An arrangement known as a Six-Port Network Analyser relies on the use of amplitude measurements, without the need to measure phase information, and is able to use relatively simple RF circuitry, providing that the Six-Port Network Analyser can be accurately calibrated. As previously known, such arrangements have severe operational drawbacks; they are slow and cumbersome to use, and are regarded primarily as laboratory instruments requiring the use of skilled operators. To fully characterise a device under test (DUT) the use of a dual configuration of Six-Port Network Analysers is needed. It can be shown that the DUT must be such that its characteristics are independent of power applied to both ports simultaneously. This is generally true only for passive devices. In particular, measurements of amplifiers would be unreliable because of the unrepresentative operating conditions. There is a strong possibility that the amplifier could oscillate instead of amplify. Broadband operation is not possible because directional isolators are needed to prevent the RF source signal circulating around a signal loop which includes the DUT.

The present invention seeks to provide an improved test arrangement.

SUMMARY OF THE INVENTION

According to a first aspect of this invention, a test arrangement includes two six-port networks having respective test ports connectable to a device under test; a common high frequency signal source which is connected to one of said test ports so as to apply said high frequency signal thereto; and means for feeding said high frequency signal as a reference directly to both six-port networks simultaneously.

According to a second aspect of this invention, a test arrangement includes two six-port networks having respective test ports connectable to a device under test; a common high frequency signal source which is switchably connected to said test ports so as to apply said high frequency signal to one or other of said ports at will; and means for feeding said high frequency signal as a reference to both six port networks simultaneously.

This avoids the need to use any narrow band components, and enables the test arrangement to be used automatically over a very wide frequency range.

BRIEF DESCRIPTION OF THE DRAWINGS

The invention is further described by way of example with reference to the accompanying drawings, in which.

DESCRIPTION OF A PREFERRED EMBODIMENT

As mentioned previously, the invention utilises a pair of six-port networks. The term "six-port" originates from the classification of types of network analyser—it is an analyser which has six ports used for measuring one-port devices, by way of contrast with a network analyser of the conventional heterodyne type mentioned previously and which has four ports. These four ports are used for; i, the incident signal applied by an RF source to the device under test (DUT); ii, an output sample 'a' of the incident wave upon the DUT; iii, an output sample 'b' of the reflected wave from the DUT; and iv, the test port to which the device under test is connected. In a six-port reflectometer, the six ports are used for; i, the incident signal applied by an RF source to the device under test; ii, the test port; iii, samples, mainly the signal 'a'; and iv, v and vi, ports which sample different combinations of the signals 'a' and 'b', where 'a' and 'b' are as previously defined.

Figure 1:
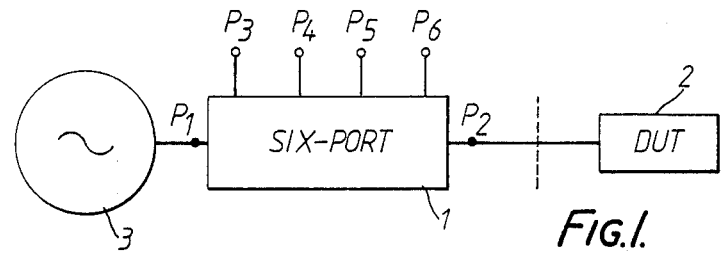
FIG. 1 is an explanatory diagram.

A simple system with a six-port network 1 connected to a device under test 2 (DUT) is shown in FIG. 1, in which an RF source 3 supplies the test signal.

It can be shown that the six-port equations for each port reduce to:

$$\Gamma = r + jx = \frac{\sum_{i=3}^{6} (F_i + jG) \cdot P_i}{\sum_{i=3}^{6} H_i P_i}$$

where Pi is the reading of a power meter connected to the 'i'th port, and port P3 samples the "a" vector only. The parameter $\Gamma$ is defined as being:

$$\Gamma = \frac{\text{reflected wave } (b)}{\text{incident wave } (a)}$$

The derivation of equations in this form is shown in the article by C. A. Hoer "Using Six-port and Eight-port Junctions to Measure Active and Passive Circuit Parameters" NBS Techn. Note 673.1975.

Calibration of the six-port reflectometer involves solving several simultaneous equations of the form given above. Different known DUTs are placed on the test-port, and the power meter readings are recorded from which the eleven unknown coefficients can be found.

It has been proposed by G. F. Engen, IEE Trans. MTT-26, No. 12 pp 951-957, December 1978, to separate the calibrations of a six-port network into two stages. The first stage—the "Six-to-Four-port reduction"—establishes the internal constraints of the six-port. These account for five coefficients of the eleven, and arise because the "sixth port" must provide a consistent indication with the others, although it was only introduced to resolve a solution choice which would otherwise result in an ambiguity. This stage can be carried out by observing the power meter measurements for a number of unknown terminations. The second stage of the calibration is identical to that used to calibrate a four-port reflectometer of the heterodyne network analyser type. This requires the use of three standards, and finds the remaining six coefficients.

Figure 2:
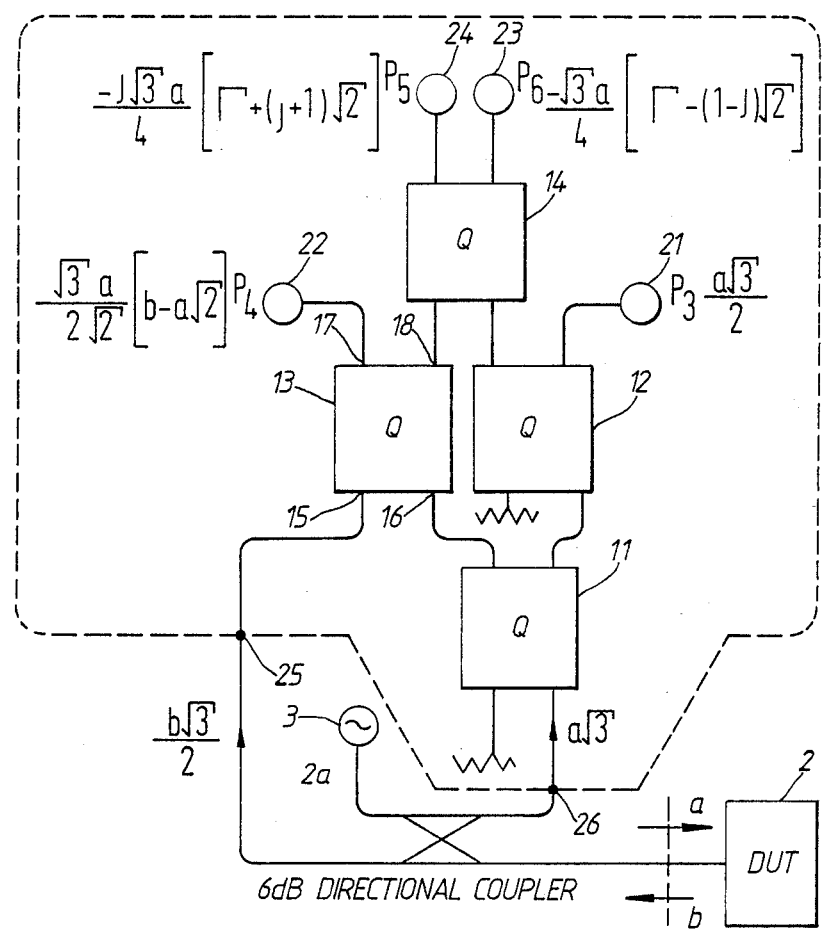
FIG. 2 is a diagramatic representation of a 6-port network.

One example of a six-port network which gives a particularly good theoretical performance is that shown in FIG. 2, as it produces a useful choice of "a" and "b" wave combinations that emerge from ports P3 to P6. These combinations are such as to hold inherent uncertainties in the measurement system to a minimum. FIG. 2 shows a circuit configuration which utilises hybrid couplers which is capable in theory of giving an almost ideal performance. This configuration was proposed by G. F. Engen in "An improved circuit for implementing the six-port technique of microwave measurements", IEE Trans. MTT-25, No. 12, December 77 pp 1080-1083.

In FIG. 2, the source 3 and the device-under-test (DUT) 2 are shown in addition to the six-port network which consists of four interconnected hybrid couplers 11, 12, 13, 14. Each hybrid coupler is a four port device having two input ports 15, 16 and two output ports 17, 18 and is constructed such that an input signal applied to input port 15 is split equally so that half of the input power emerges from each of ports 17 and 18 (neglecting any internal losses) and the signal at port 18 lags the signal at port 17 by 90°. This is represented diagramatically in the left top corner of FIG. 3. Conversely, the signal applied to input port 16 is split equally between the two output ports 17 and 18, but this time the signal on port 17 lags by 90° the signal at port 18. It is usual to assume that there is no net phase lag across the hybrid coupler, but in practice this will not be so but will cancel out in the configuration of interconnected hybrid couplers which is illustrated.

By each of the four output ports 21, 22, 23, 24 of the six-port network is shown the output signal value which results from the application to the two input ports 25, 26 of the indicated proportions of the reflected wave b and the incident wave a, it being noted that $\Gamma = b/a$. The conventional designation P1 to P6 of the six-port network is also shown in FIG. 2.

The use of the two six-port networks enables the magnitude and phase characteristics of two-port DUT to be inferred from magnitude measurements alone. Previously the use of a dual six-port network analyser has incurred serious drawbacks. One drawback has already been mentioned, i.e. that the DUT must be such that its characteristics are independent of power applied to both input and output ports simultaneously. Another drawback is that the calibration procedure by which the S-parameters are determined involves the use of a switched phase shifter and switched attenuator to provide three or more different but repeatable relationships between the two waves at the two test ports (the ports to which the DUT is connected). Also for wide-band operation many narrow band precision air-line standards are needed. Furthermore it is invariably necessary to provide narrowband isolators to prevent power circulating between the two six-port networks and through the DUT more than once.

Figure 3:
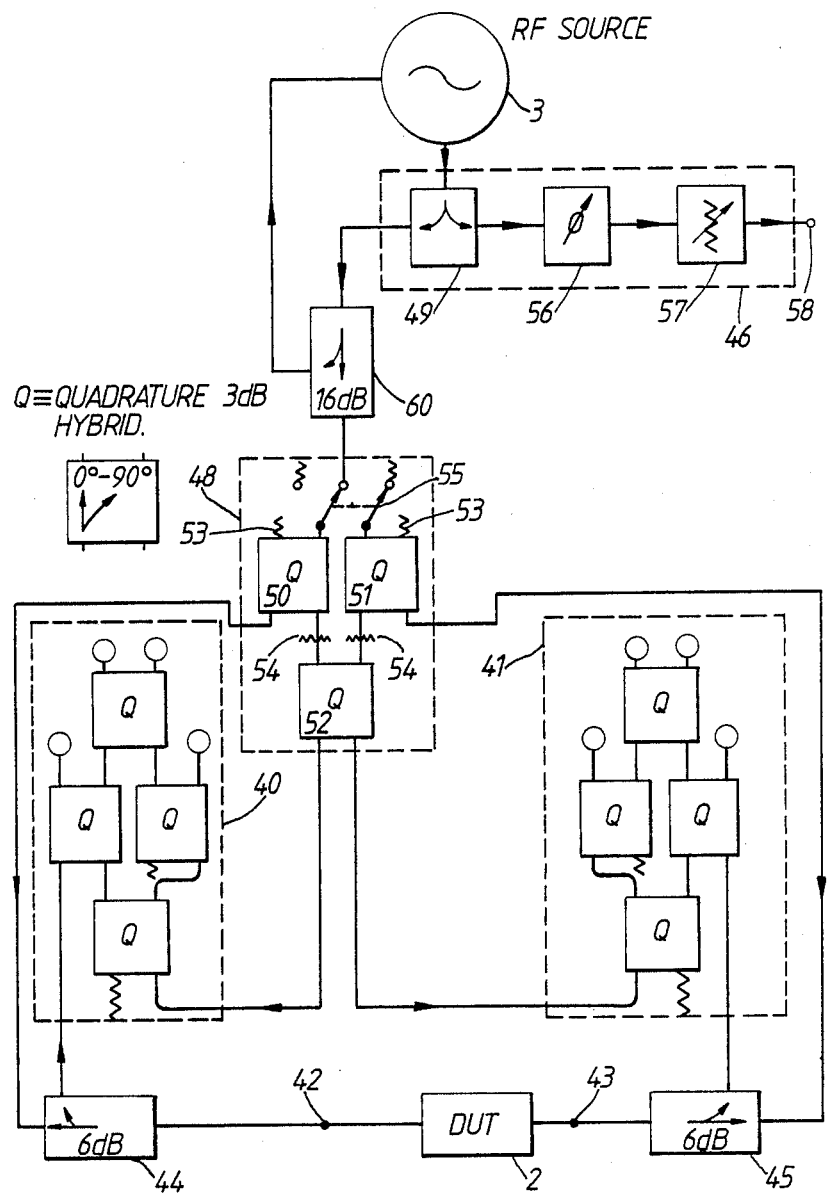
FIG. 3 shows an embodiment of the invention.

An embodiment of the present invention is shown in FIG. 3 which allows these drawbacks to be overcome and permits broadband operation as it does not require the use of narrowband components or standards.

Referring to FIG. 3, two six-port networks 40 and 41 are connected to two test ports 42 and 43 between which, in operation, the DUT 2 is connected. Each network 40 and 41 takes the form shown in FIG. 2, and two 6 dB directional couplers 44, 45 are connected as shown. These couplers 44, 45 are linked to the RF source 3, which generates the excitation signal at a required frequency, via a 16 dB directional coupler 60, a switching network 48 and a further power splitter 49 which form part of a termination generator 46, the latter being used to calibrate the networks 40 and 41. The small fraction of the incident power which is split off the coupler 60 is routed back to the source 3 as a negative feedback signal to control the level of the output power of the source 3. A control circuit (not shown) is included in the feedback loop to compensate for the power variations that would occur as the frequency of the RF source is swept over a wide band.

The switching network 48 consists of three interconnected hybrid couplers 50, 51, 52, the fourth ports of couplers 50, 51, being terminated at matched loads 53 in the usual way, and a 3 dB attenuator 54 being interposed at each of the two input ports of coupler 52. The switching network 48 also includes a switch arrangement 55 which can connect either coupler 50 or coupler 51 to the RF source 3. The termination generator 46 has a variable phase shifter 56 and a variable attenuator 57 which are used to alter the phase and magnitude of the RF source signal which is fed to output port 58.

In operation, power from the RF source 3 is fed to the device under test either via the test-port 42 or via the test port 43, and the incident wave and the reflected waves are coupled via the couplers 44 and 45 to the six-port networks 40 and 41. The power emerging at the four output ports of the networks 40 and 41 is measured and the expressions (which are shown in FIG. 2) are calculated to determine the characteristics of the DUT 2.

The configuration of the switching network 48 is such that regardless of the switch position (and hence regardless of which test port 42 or 43 is receiving power from the RF source 3) both six-port networks 40 and 41 receive a sample of the RF power via coupler 52 so that both six-port networks operate simultaneously. The sample is taken off after the switching network 48 to minimise the effects of non-repeatability of the switch arrangement 55 and the effects of any non-repeatability can be ratioed out during calculation of the wanted parameters. The configuration of the switching network 48 allows DUT's which are active devices to operate into a matched load, so no problems are caused for amplifier measurement. It will be noted that isolators are not required, so broadband operation is possible.

The two six-port networks are of the vector-voltmeter type; a vector-voltmeter find the vector ratio of the two vector voltages. Each of the six-port networks has two inputs (corrresponding to points 25 and 26 of FIG. 2), the signals at which are ratioed together. With the switch 55 in the forward position shown in FIG. 3, six-port network 40 measures the reflection wave of the DUT 2 at test port 42, and six-port network 41 measures the transmission of the DUT 2 at test port 43. When the switch 55 is moved to the reverse position, six-port network 41 measures reflection at test port 43, and six-port network 40 measures the transmission at test port 42. Hence all four of the Scattering parameters (S-parameters) can be measured individually, provided that the six-port networks are accurately calibrated.

To achieve correct calibration, the arbitrary termination generator 46 is used.

Calibration of the dual six-port networks is carried out in two stages. In the first stage the sixport network is reduced to four-ports, that is to say the number of unknown coefficients is reduced to the number associated with a four-port network. In the circuit shown in FIG. 3, the reduction coefficients remain constant for a particular six-port network irrespective of whether it is being used to make reflection or transmission measurements.

The six-port networks have twelve error paths which are accounted for by calibration, and the circuit shown in FIG. 3 has extra leakage paths associated with the configuration of hybrids 50, 51, 52 used to feed reference samples of the RF source signal to the two six-port networks. These leakage paths are excited and quantified using the termination generator 46. The power splitter 49 divides the RD source power between the two six-port networks on the one hand, the switchable phase shifter and switchable attenuator on the other hand.

In accordance with the first mentioned aspect of the invention it is envisaged that the switch 55 may be dispensed with so that the RF signal is always routed to the same test port, but the reference signals from couplers 52 are still each routed to a respective six-port network 40 and 41. This configuration is rather less convenient to use as it is necessary to repetitively reverse the connections to the DUT 2 during the test sequence.

What is claimed is:

1. A test arrangement including two six-port networks having respective test ports connectable to a device under test; a common high frequency signal source which is connected to only one of said test ports so as to apply said high frequency signal thereto; and means for feeding said high frequency signal as a reference directly to both six-port networks simultaneously.

2. A test arrangement including two six-port networks having respective test ports connectable to a device under test; a common high frequency signal source which is switchably connected to both of said test ports so as to selectively apply said high frequency signal to only one or the other of said ports at any one time; and means for feeding said high frequency signal as a reference to both of said six-port networks simultaneously.

3. A test arrangement as claimed in claim 2 and wherein said means includes two power splitters which are switchably connected to said high frequency signal source, with one output of each power splitter being coupled to a respective test port, and the other output of each power splitter being coupled via a power attenuator to both six-port networks.

4. A test arrangement as claimed in claim 3 and wherein said power splitters are hybrid couplers, and a ganged two path switch is provided so as to switchably connect said high frequency signal source to the two power splitters such that the switch is operative to connect a characteristic impedance to the input of that power splitter which is not coupled to the high frequency signal source.

5. A test arrangement as claimed in claim 4 and wherein said means includes a third hybrid coupler having two inputs connected respectively to the two first-mentioned hybrid couplers via said power attenuators.

6. A test arrangement as claimed in claim 2 and wherein each test port is connected to said high frequency signal source and a respective six-port network via a directional coupler which diverts a predetermined proportion of incident power to the six-port network.

* * * * *